(12) United States Patent
Szepesi

(10) Patent No.: US 7,489,199 B2
(45) Date of Patent: Feb. 10, 2009

(54) SATURATION DETECTOR AND WARNING CIRCUIT INCLUDING CLAMP

(76) Inventor: Thomas Szepesi, 12846 Arroys de Arguello, Saratoga, CA (US) 95070

( * ) Notice: Subject to any disclaimer, the term of this patent is extended or adjusted under 35 U.S.C. 154(b) by 35 days.

(21) Appl. No.: 11/764,177

(22) Filed: Jun. 15, 2007

(65) Prior Publication Data

US 2008/0001666 A1    Jan. 3, 2008

Related U.S. Application Data

(60) Provisional application No. 60/804,829, filed on Jun. 15, 2006.

(51) Int. Cl.
*H02H 7/20* (2006.01)
(52) U.S. Cl. .................................. 330/298; 330/207 P
(58) Field of Classification Search .................. 330/298, 330/207 P, 252, 69
See application file for complete search history.

(56) References Cited

U.S. PATENT DOCUMENTS

| 6,734,729 | B1 * | 5/2004 | Andrys et al. ............... 330/129 |
| 6,812,466 | B2 * | 11/2004 | O'Connor et al. ......... 250/341.1 |
| 6,982,594 | B2 * | 1/2006 | Snider et al. ................ 330/140 |
| 7,126,386 | B2 * | 10/2006 | Tumer et al. .................. 327/70 |
| 7,301,402 | B2 * | 11/2007 | Norris et al. ................ 330/298 |

* cited by examiner

*Primary Examiner*—Henry K Choe

(57) ABSTRACT

A saturation detection and warning circuit having an adaptive threshold voltage is disclosed. The disclosed circuit can also be used to detect the impending drop out of the low drop out linear voltage regulator. A clamp circuit that clamps the amplifier's output voltage at a voltage that is separated from the adaptive threshold of the saturation detector and warning circuit by a controlled offset voltage is also disclosed.

12 Claims, 8 Drawing Sheets

SATURATION DETECTOR AND WARNING CIRCUIT INCLUDING CLAMP

RELATED CASES

The present application claims priority to U.S. Provisional Patent Application Ser. No. 60/804,829, filed on Jun. 15, 2006, titled "Saturation Warning Circuit for Amplifiers". That application is incorporated herein by reference.

BACKGROUND OF THE INVENTION

In amplifiers it is often useful to have a warning before the amplifier's output reaches saturation to avoid significant distortion. Typically, the distortion grows gradually at first as the output signal level approaches saturation, and increases abruptly as the amplifier reaches saturation and is driven beyond the saturation onset. The saturation detection and warning is especially useful for audio amplifiers.

The actual output level where saturation occurs depends on a number of variables: process parameters, environmental variables like temperature, and application variables like load current, supply voltage, and others. In order to maximize the utilized output range of the amplifier it is advantageous to choose the threshold of the saturation detector and warning circuit as close to the output saturation level as possible, yet low enough to avoid significant distortion that results from output clipping (which occurs when the amplifier is driven into saturation).

Another application for a saturation detector and warning circuit is in Low Drop out Linear regulators (LDO-s) as a drop out detector and warning circuit. In these voltage regulators it is useful for the system that utilizes them (e.g. a portable system like cellular phone or PDA) to sense the impending loss of output voltage regulation and take appropriate action, like saving all data in before it happens. Hence, a circuit that detects the impending drop out of an LDO is useful.

For clarity of discussion it is worthwhile to point out that "saturation" is used in different ways when it refers to an amplifier or when it refers to a MOSFET transistor. In an amplifier, saturation means that the output of the amplifier hits its limit and essentially does not respond to further increase of its input voltage (the amplifier's output is essentially clamped, typically at close to the supply voltage). In other words the amplifier does not operate as a linear amplifier anymore in saturation. In an amplifier that utilizes feedback, i.e. most of the linear amplifiers, this means that the feedback loop is no longer closed. In contrast, if the amplifier is realized using MOSFET transistors the output MOSFET transistor typically operates in its non-saturated triode (or resistive) region when the amplifier is in, or close to, saturation. Consequently typically a detector circuit that detects the saturation or impending saturation of an amplifier actually detects that its output transistor(s) is operating in, or entering into, its non-saturated resistive (or triode) operating region.

Figure 1:
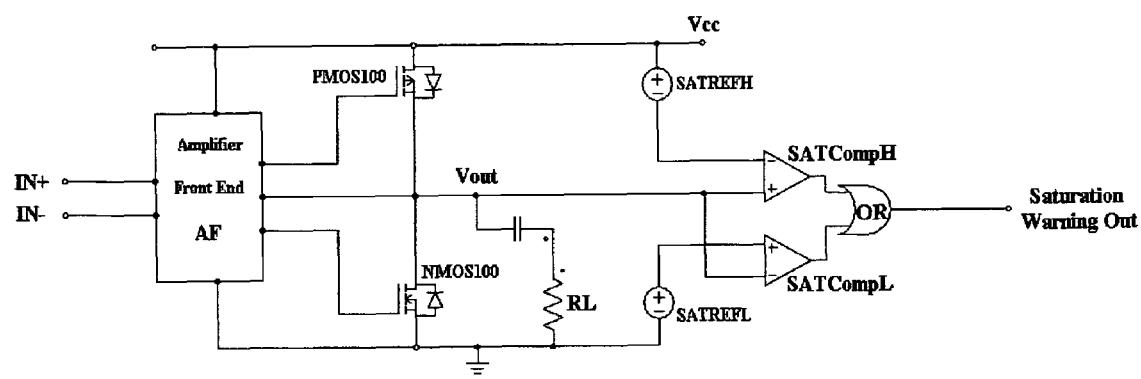

FIG. 1 shows a prior art saturation detector and warning circuit. The amplifier 101 consists of an Amplifier Front End (AF) that drives the two output MOSFET transistors PMOS1 and NMOS1, forming an amplifier with rail-to-rail output voltage capability. Circuit 100 forms the saturation detector and warning circuit. The comparator SATCompH senses the onset of high side saturation of the amplifier by comparing the drain to source voltage of the high side output MOSFET, PMOS100, with a reference voltage SATREFH. SATREFH is typically a small voltage compared to the supply voltage of the amplifier Vcc. This voltage can be constant, e.g. 200 mV, in some embodiments, or can be a small fraction of the supply voltage Vcc, e.g. 0.05*Vcc, in other embodiments. Similarly, SATCompL and SATREFL sense the onset of low side saturation of the amplifier by comparing the drain to source voltage of the low side output MOSFET, NMOS100, with a reference voltage SATREFL.

The logic "H" level at the output of comparator SATCompH indicates that the amplifier is close to high side saturation. Similarly logic "H" level at the output of comparator SATCompL indicates that the amplifier is close to low side saturation. The outputs of the two comparators are "OR" connected. The output of the "OR" gate is logic "H" if the amplifier is close to either low side or high side saturation, hence it can be used as a saturation detection or warning signal.

The disadvantage of the prior art solution is that it does not track the variation of the saturation voltage level caused by process, temperature supply voltage and load current variations. This results in over-design, as the threshold levels SATREFH and SATREFL have to be selected for worst case conditions. As a consequence, the prior art circuits may signal the onset of saturation too early under typical conditions, thereby limiting the usable output voltage swing of the amplifier.

LIST OF FIGURES

The present invention is illustrated by way of example, and not by way of limitation, in the figures of the accompanying drawings and in which like reference numerals refer to similar elements and in which:

FIG. 1 shows a prior art saturation detector and warning circuit

Figure 2:
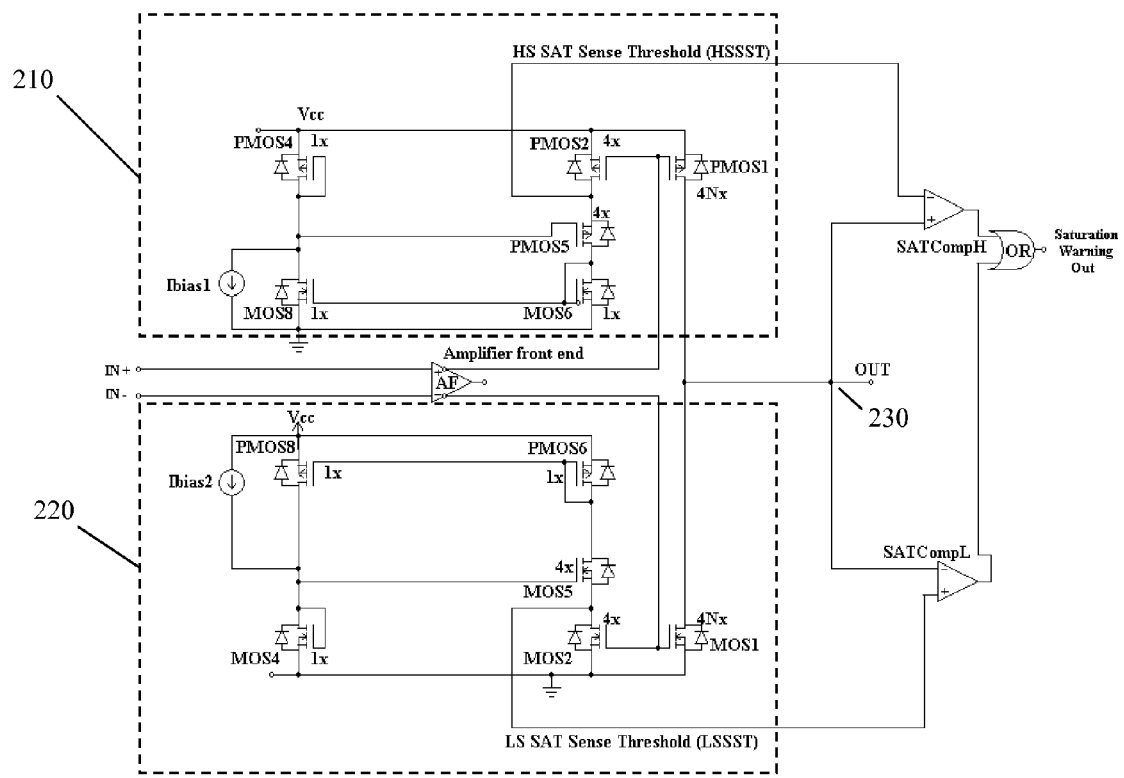
Figure 3:
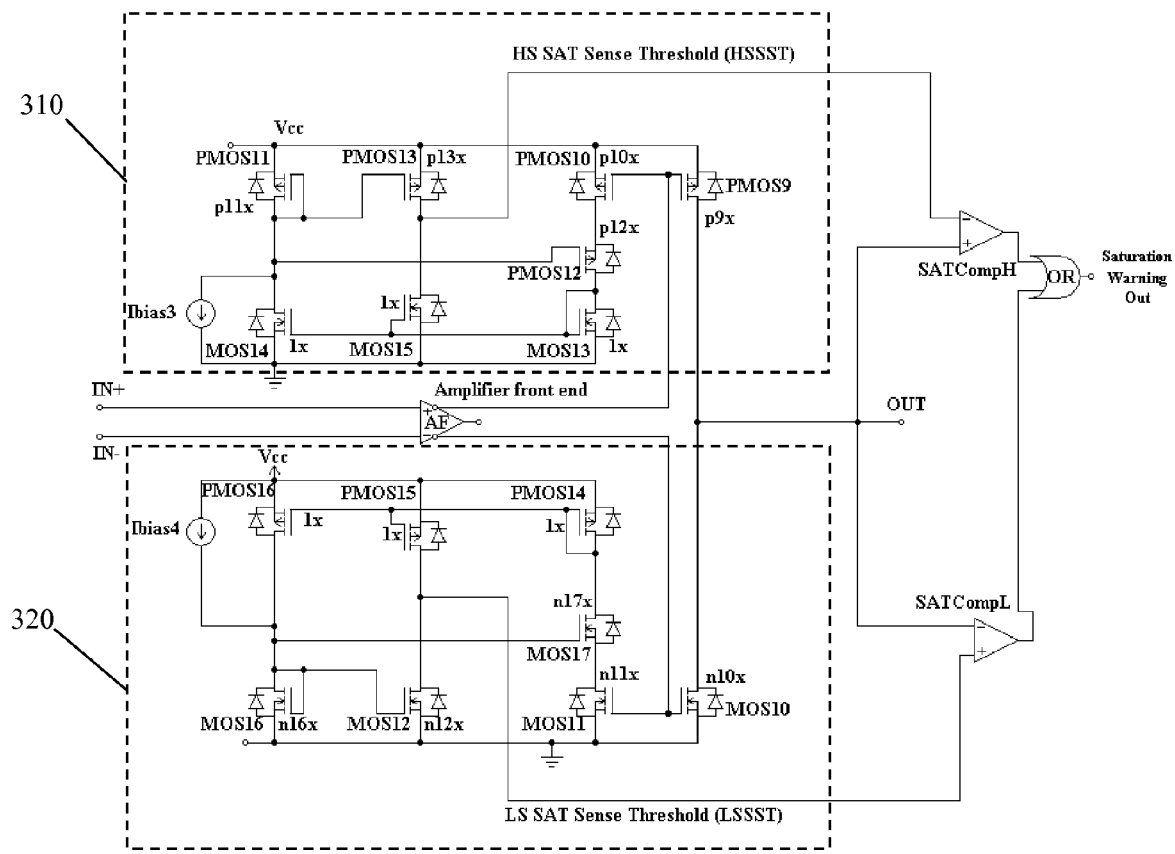
Figure 4:
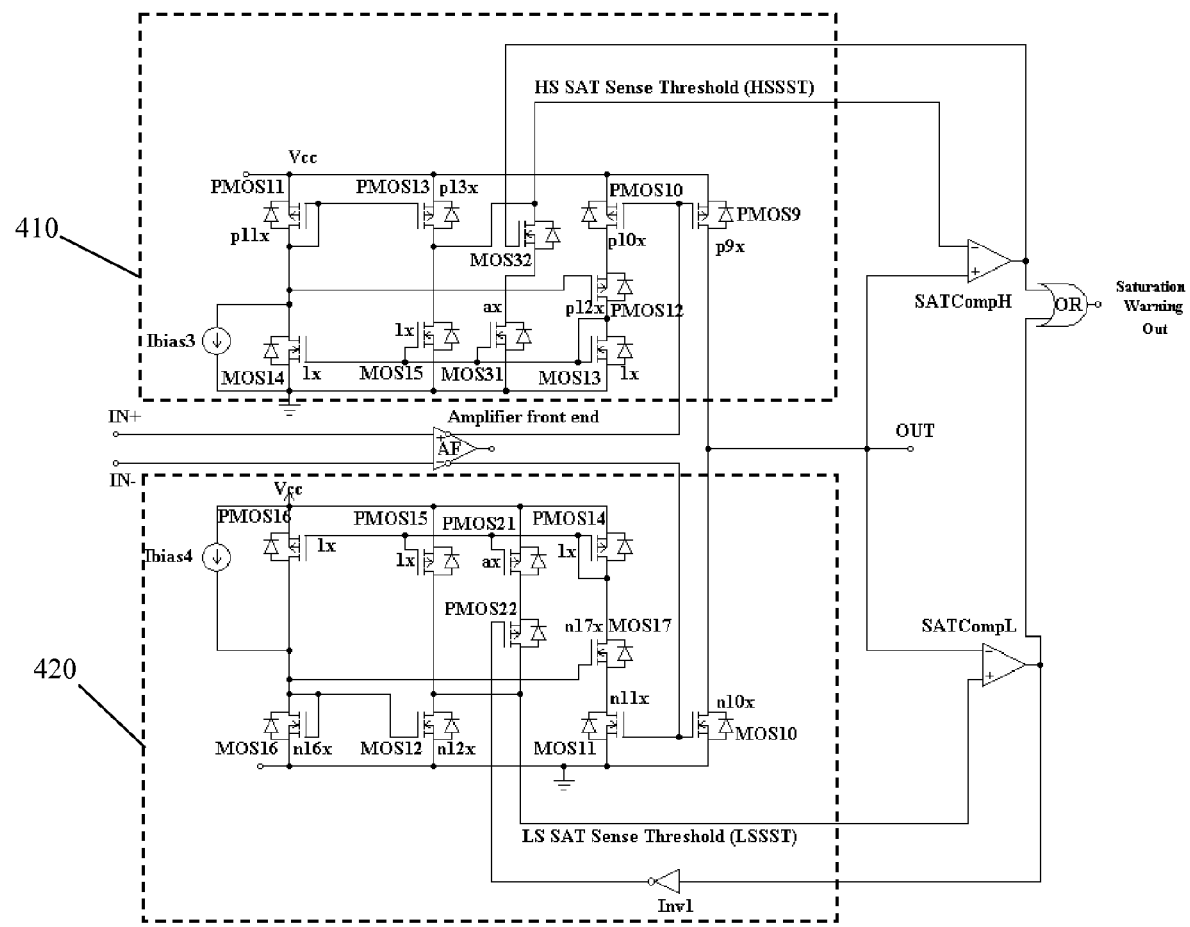
Figure 5:
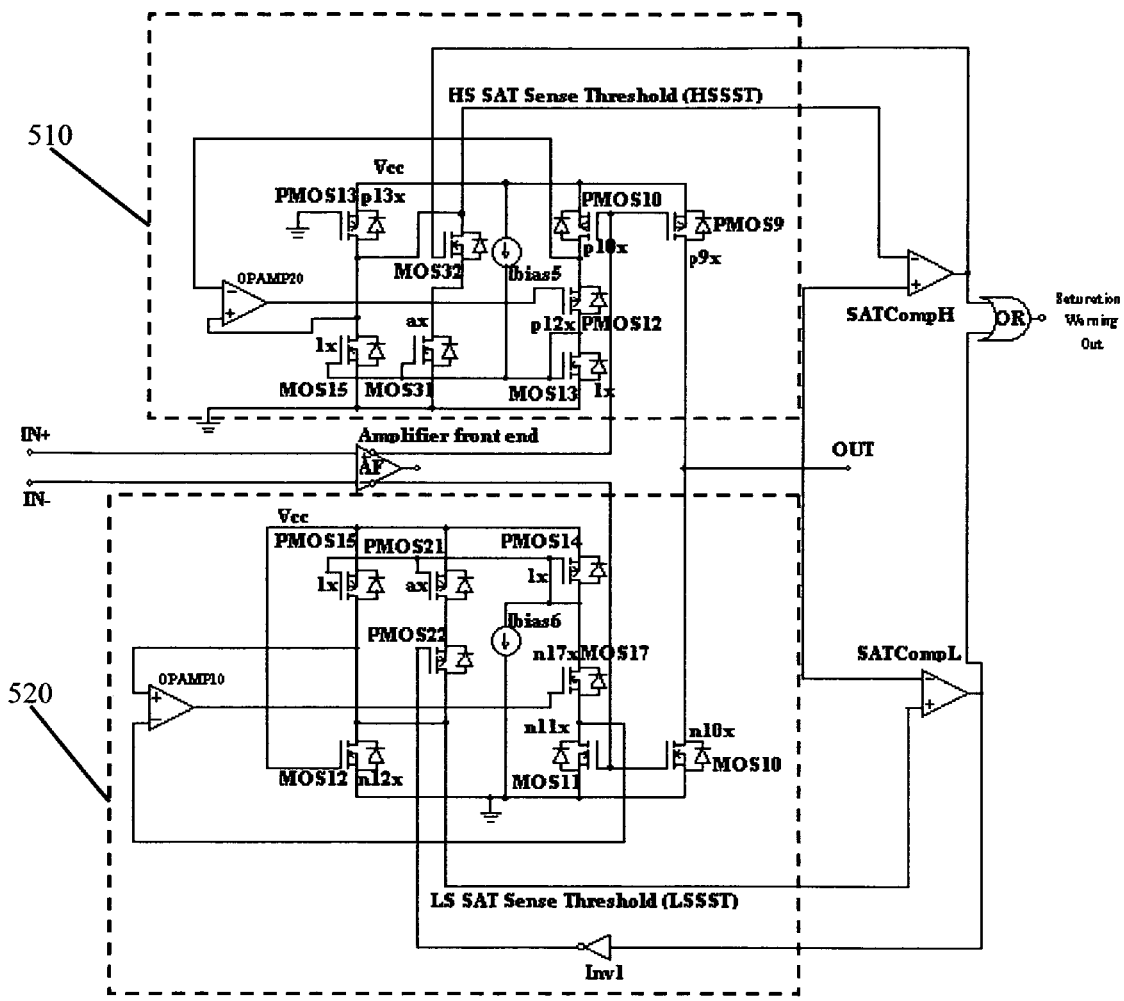
Figure 6:
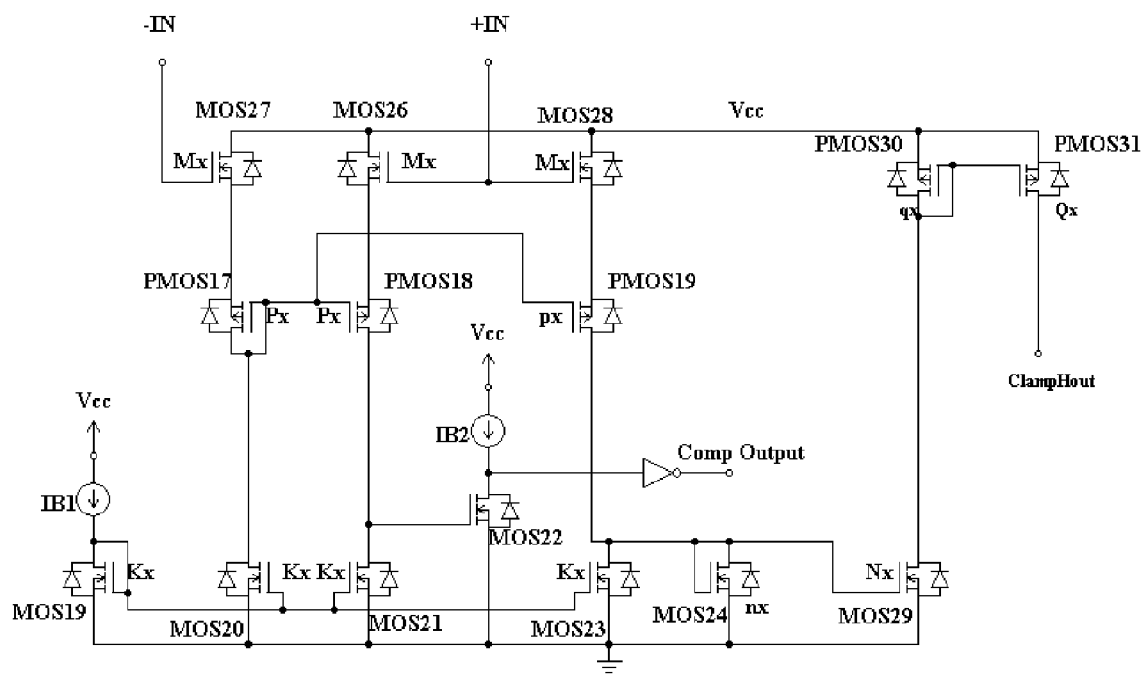
Figure 7:
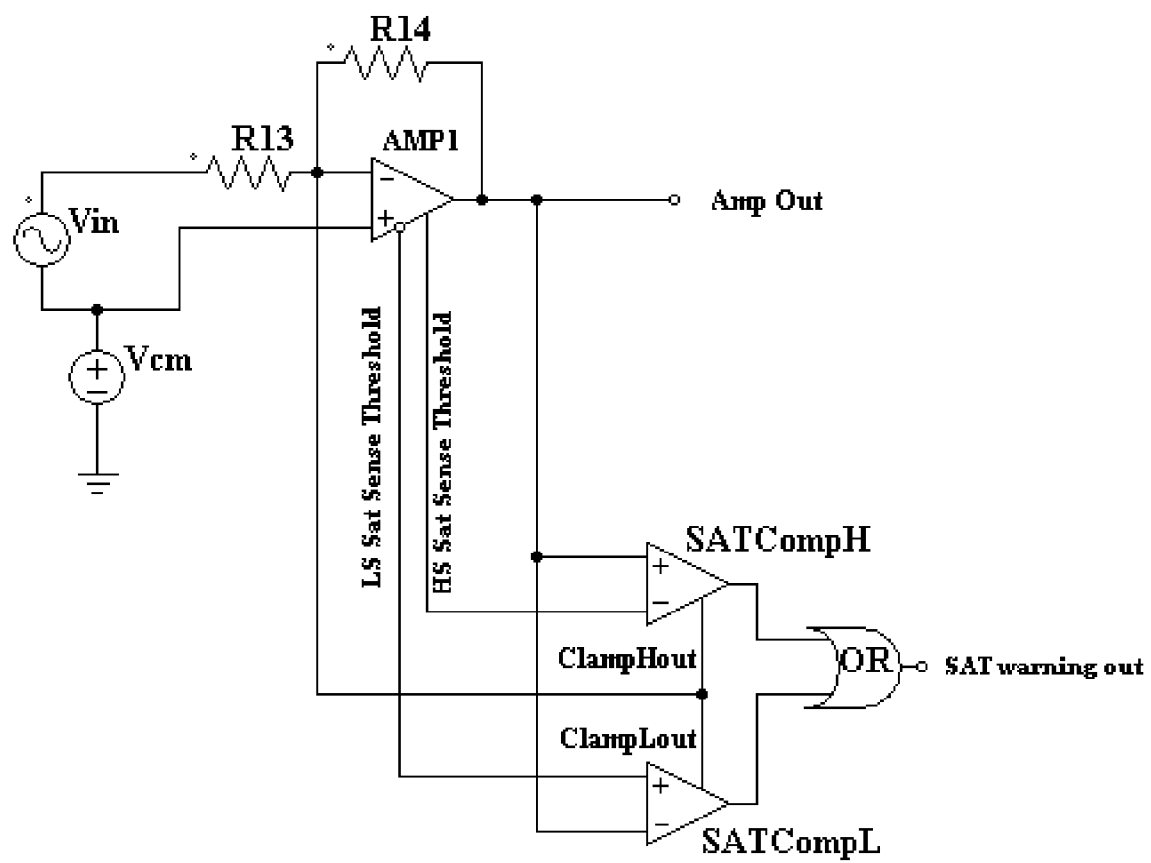
Figure 8:
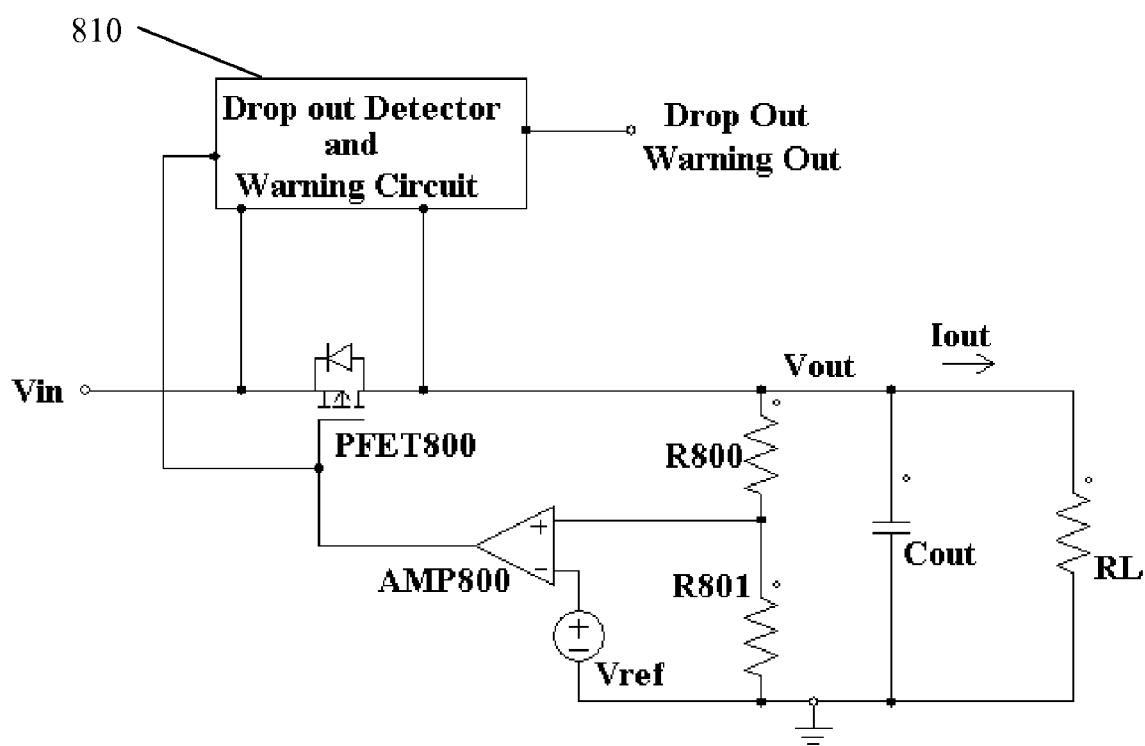

FIG. 2. shows one embodiment of the adaptive saturation detector and warning circuit of the invention FIG. 3. shows another embodiment of the adaptive saturation detector and warning circuit of the invention FIG. 4. shows yet another embodiment of the adaptive saturation detector and warning circuit of the invention FIG. 5. shows yet another embodiment of the adaptive saturation warning and detector circuit of the invention FIG. 6. shows a comparator circuit of the invention including circuit to generate an adaptive soft clamp output signal of the invention FIG. 7. shows a block diagram of an inverting amplifier utilizing the adaptive saturation detector and warning and soft clamping circuits of the invention FIG. 8. shows a low drop out linear voltage regulator (LDO) utilizing the saturation detector and warning circuit of the invention for drop out detection and warning.

Although some device numbers are duplicated across figures, i.e. MOS12 in FIG. 3, FIG. 4 and FIG. 5, the sizes and aspects of these elements need not be identical across embodiments.

DETAILED DESCRIPTION

In one embodiment, the present invention creates a saturation detector and warning circuit that can detect the impending saturation of an amplifier in an adaptive way, maximizing the usable output voltage swing of the amplifier under process, temperature, supply voltage and load current variations. This is achieved by a circuit that creates a saturation detection reference voltage (corresponding to SATREFH or SATREFL) that tracks changes in process variations, temperature, supply voltage and load current.

In one embodiment, the system of the invention creates an adaptive soft clamp circuit to clamp the amplifier's output in saturation, at a level that is slightly above the threshold level of the saturation detector and warning circuit of the invention, but that is slightly below of the hard saturation output level of the amplifier. The output signal of the soft clamp circuit is fed back to the input of the amplifier. In this way the feedback loop of the amplifier remains active when the amplifier's output is clamped, resulting typically in cleaner output waveform and improved distortion in some applications.

FIG. 2 shows one embodiment of the invention. The high side and low side circuits 210, 220 are mirror images of each other: all PMOS and NMOS transistors in the high side circuit 210 are replaced with NMOS and PMOS transistors respectively in the low side circuit 220. Also, all sink and source current sources are replaced with source and sink current sources respectively. Accordingly, in the following descriptions of the different embodiments only the low side section of the saturation warning circuits will be described. The high side circuits work symmetrically. Thus, one of skill in the art would understand how to implement the high side/low side circuit pair, based on the description of one side.

In the embodiment of FIG. 2. SATCompL is the low side saturation warning comparator. SATCompL's inverting (−) input is tied to the output 230 of the amplifier. If the voltage level on the output 230 becomes lower than the LS SAT Sense Threshold (LSSST) voltage (corresponding to SATREFL in FIG. 1) on the + input of the comparator, the output of the comparator goes high, indicating that the amplifier is close to low side saturation.

MOS1 is the low side NMOS output transistor of the amplifier. MOS1 is typically a large device. In the following, "MOS" or "NMOS" designation will mean N channel MOSFET transistors, while "PMOS" designation will mean P channel MOSFET transistors. There is a size designator next to every transistor in all the embodiments. These size designators indicate the size of the devices relative to a unit device size that is designated by "x". The unit device size, its W/L (channel Width over channel Length), can be practically any value chosen by the circuit designer. For matching devices the channel length, L, is typically chosen to be the same. The device size is scaled by varying the device's width, W. In typical embodiments the relative sizes of the NMOS and PMOS transistors are important, but their absolute size is of limited importance for the proper operation of the circuits.

In FIG. 2 MOS2 is a current mirror transistor, matched with MOS1 but typically much smaller in size. MOS2 mirrors the current of MOS1 divided by a factor of N (with the device sizes shown in FIG. 2.). The drain current of MOS2 flows through MOS5 and is turned around via PMOS6-PMOS8 current mirror. Hence the voltage drop Vds(4) on the MOS4 diode connected transistor is:

$$Vds(4)=Vtn+dV=Vtn+\sqrt{((Iout/N)/(k*1*W/L))} \quad (Eq.1.)$$

Vtn is the threshold voltage of the MOS4 NMOS transistor (which is approximately equal to the threshold voltages of all NMOS transistors in the circuit), dV is the gate-source overdrive voltage that is needed to generate a certain drain current in the transistor (in this case the drain current is Iout/N), Iout is the output current of the amplifier that is essentially equal to the drain current of MOS1 if the amplifier is sinking current, k is a transistor constant (equal to uCox/2, as is known in the art), and W/L is the channel Width/Length ratio of the unit transistor.

In Eq.1. and all further equations we use "W/L" designation for the unit transistor size instead of "x", to make the equations more familiar in format. As it is well known in the art, the dV overdrive voltage is approximately equivalent to the drain source voltage, Vdssat, of the transistor at the edge of the saturated (pentode) operating mode. In the saturated operating mode, the output impedance of the MOSFET is high, accordingly transistors used in a typical grounded source amplifier have high small signal gain operating in their saturated mode. If the Vds drops below Vdssat, the transistor starts to operate in its linear or triode region, where its output impedance is significantly lower and its small signal gain is also significantly lower in a typical grounded source amplifier application.

As it is known in the art, if the gain of an amplifier significantly decreases its distortion typically increases. Hence, sensing the point where the output transistor MOS1 enters in its resistive (triode) region from its saturated (pentode) region, i.e. the point where its drain source voltage Vds drops below Vdssat, can be a good indication of the impending saturation of the amplifier. The embodiment of FIG. 2 sets the LS SAT Sense Threshold voltage, LSSST, the sense limit of SATCompL, at the Vdssat point of the MOS1 output transistor. The voltage on the source of MOS5 can be written as follows:

$$V(LSSST) = Vds(4) - Vgs(5) = \quad (Eq. 2.)$$
$$= (Vtn + \sqrt{((Iout/N)/(k*W/L))}) -$$
$$(Vtn - \sqrt{((Iout/N)/(k*4*W/L))}) =$$
$$= 0.5 * \sqrt{((Iout/N)/(k*W/L))}$$

In Eq.2. Vds(4) designated the drain source voltage of transistor MOS4, while Vgs(5) designates the gate source voltage of transistor MOS5, both in FIG. 2. The Vdssat voltage of the MOS1 output transistor, Vdssat(1), can be written as follows:

$$Vdssat(1)=\sqrt{((Iout)/(k*4*N*W/L))}=0.5*\sqrt{((Iout)/(k*N*W/L))} \quad (Eq.3.)$$

Comparing Vdssat(1) in Eq.3 with Eq.2., it is clear that the LSSST voltage generated on the source of MOS5 is equal with the Vdssat voltage of the output transistor MOS1.

If the output voltage decreases further, decreasing the Vds voltage of MOS1 below Vdssat, the SATCompL comparator's output will become logic "H" level, indicating that the amplifier is close to low side saturation. Increasing the amplitude of the amplifier's output signal further will drive the drain voltage of MOS1 transistor below its Vdssat level typically causing a significant drop in the gain of the output stage as MOS1 enters into its triode region. By using the output transistor's Vdssat voltage as the threshold for the saturation warning circuit, as shown in FIG. 2., the embodiment uses approximately the earliest point that shows a deterioration in the operation of the amplifier, namely the point where its open loop gain starts to decline due to the decrease of the output impedance and gain of the output transistor MOS1 resulting in an increase of distortion.

In the circuit of FIG. 2. transistors MOS4, MOS5, PMOS6 and PMOS8 together with bias current source Ibias2 form a biasing circuit. MOS2 transistor aside of its role as a current mirror transistor, as described above, also acts as a replica transistor, the Vds voltage of which replicates the Vds voltage of output transistor MOS1 at the trip point of the saturation detection and warning comparator SATCompL.

The hard negative saturation level of the amplifier in FIG. 2., i.e. its minimum output voltage is the minimum Vds voltage of MOS1, Vdsmin(1):

$$Vdsmin(1)=Iout*Rdson(1)=Iout/((2*k*(4*N*W/L)*(Vcc-Vtn)) \quad (Eq.4.)$$

Substituting Vdssat(1)=sqrt((*I*out/(k*4*N*W/L)):

$$Vdsmin(1)=0.5*((Vdssat(1))^2)/(Vcc-Vtn) \quad \text{(Eq.5.)}$$

Where Rdson(1) is the drain source resistance of transistor MOS1 when it is operating in its resistive (triode) region.

Typically Vdssat is much smaller than (Vcc−Vtn), and from this follows that Vdssat is typically much higher than Vdsmin. While the distortion of the amplifier starts to increase when Vout falls below Vdssat(1), it can be still acceptably low in same applications, and the amplifier can generate lower output voltage levels without significant distortion. In other words the saturation warning circuit shown in FIG. 2. may in some cases warn too early, before the amplifier's output voltage gets close enough to its minimum, Vdsmin, limit (or maximum limit on the high side) to cause a significant increase in distortion. It is therefore often desirable to set the saturation warning threshold lower than Vdssat.

An alternative embodiment of the invention, shown in FIG. 3, sets the saturation detection and warning threshold at a well defined fraction of the Vdssat voltage of the output transistor, MOS10. In the low side saturation sensing threshold circuit 320 MOS11 acts as a current mirror transistor, mirroring the current of the MOS10 output transistor with a given fixed ratio. The LSSST voltage is generated as the drain source voltage of MOS12 NFET replica transistor that is operated in its triode mode. Transistors MOS16, MOS17, PMOS14, PMOS15 and PMOS16 form a biasing circuit. Using the device sizes shown in FIG. 3. the Vds voltage of MOS12, Vds(12), can be written as follows:

$$Vds(12)=V(LSSST)=Iout*(n11/n10)*Rdson(12) \quad \text{(Eq.6.)}$$

$$Vgs(12)=Vtn+\text{sqrt}(Iout*(n11/n10)/k*n16*W/L)=Vtn+dV(12) \quad \text{(Eq.7)}$$

Where Rdson(12) is the drain source resistance of transistor MOS12. Substituting Eq.7 into Eq.6, and using the well known relationship between Rdson(12) and dV(12):

$$Vds(12)=Iout*(n11/n10)*1/((2*k*n12*W/L)*\text{sqrt}(Iout*(n11/n10)/k*n16*W/L)) \quad \text{(Eq.8)}$$

Substituting the Vdssat voltage of the output transistor MOS10 Vdssat(10)=sqrt(Iout/k*n10*W/L) into Eq.8:

$$Vds(12)=Vdssat(10)*(\text{sqrt}(n11*n16))/(2*n12)=V(LSSST) \quad \text{(Eq.9)}$$

Eq.9 yields a ratio, Z, between the saturation warning threshold voltage, V(LSSST) and the saturation Vds voltage, Vdssat(10) of the MOS10 output transistor:

$$Z=V(LSSST)Vdssat(10)=(\text{sqrt}(n11*n16))/(2*n12) \quad \text{(Eq.10)}$$

This ratio is less than one for all practical circuits and depends on the relative device sizes of MOS11, MOS16 and MOS12 transistors. Therefore, this ratio is very well controlled and very stable. As a practical example values n11=4, n16=1, and n12=2 can be chosen. These transistor sizes result in:

$$V(LSSST)=0.5*Vdssat(10)$$

In order to keep MOS12 operating in its triode mode n12 should be larger than n16. As another example, choosing n11=9, n16=1 and n12=2 yields a threshold value of 0.75*Vdssat. Choosing the device sizes properly, practically any fraction of the Vdssat(10) can be generated on the drain of MOS12, and used as saturation sensing threshold.

Additionally, the area ratios of PMOS16, PMOS15 and PMOS14 (which is shown as 1 in FIG. 3.) can be changed, if needed, to set up an exact ratio that can not be generated just by varying the n11, n16, n12 area ratios. The size of MOS17 can be chosen to be the same as the size of MOS11 and about 4× the size of MOS16, similarly to sizes used in the embodiment shown in FIG. 2. However, for higher accuracy in one embodiment it is chosen so that the Vds voltage of MOS11 equals the Vds of MOS10 at the saturation warning threshold. If the threshold is set to Z*Vdssat(10) (Z<1) the size of M17 can be chosen the following way to satisfy the above condition for higher accuracy:

$$\text{sqrt}(n11/n16)-\text{sqrt}(n11/n17)=Z \quad \text{(Eq. 11.)}$$

This condition leads to the well known n11=n17=4*n16 condition if Z=1 which is used in the embodiment of FIG. 2. Ensuring that the drain-source voltages of the output transistor MOS10 and current mirror transistor MPS11 are approximately equal (which increases the accuracy of the circuit, as mentioned above) can also be achieved by using an amplifier that monitors the difference between the two drain-source voltages and drives (servos) the state of MOS17 transistor to keep them approximately equal, as is well known in the art.

It is often desirable to add a small hysteresis to the operation of comparators to avoid chattering due to noise at the transitions. The embodiment shown in FIG. 4 shows a circuit that adds a controlled hysteresis to the operation of the fractional Vdssat threshold circuit shown in FIG. 3. In the low side saturation sense threshold circuit 420 devices PMOS21, PMOS22 and Inv1 inverter are added to the low side of the embodiment of FIG. 3. A symmetric set of devices MOS32 and MOS31 are added to the high side. On the high side and equivalent of Inv1 inverter is not needed.

In one embodiment, PMOS21 is matched to PMOS14, PMOS15 and PMOS16, except for size. Its size, designated with a×, is a small fraction of the size of PMOS15, 1×. Its current is a small fraction of the current of PMOS15. When the comparator output transitions from low to high, PMOS22 transistor is turned on via Inv1 inverter and the current generated by PMOS21 is added to the current of PMOS15. This increases the drop on MOS12, creating a small hysteresis. The size of the hysteresis can be controlled by the size ratio of PMOS21 ad PMOS15, i.e. by the value of "a". If the desired value of "a" results in a device size (W/L ratio) that is too small to implement in practice, a resistor can be added between PMOS21's source and ground to decrease its drain current. The size of PMOS22 switch is typically much larger than the size of PMOS21, it can be chosen to 1×, about the size of PMOS15, or larger. Similar considerations are valid for the symmetric set of devices MOS32 and MOS31 on the high side.

FIG.5 shows another embodiment of the saturation detector and warning circuit. In this embodiment the threshold is set to be a multiple of the Vdsmin of the output transistor MOS10. In the low side saturation sense threshold circuit 520 in FIG. 5, MOS11 current mirror transistor, MOS12 replica transistor and MOS17 are matched to MOS10 except for size. Transistors MOS17, PMOS14, PMOS15, Ibias6 and amplifier OPAMP10 form a biasing circuit. MOS12 replica transistor is operating in its resistive (triode) region, biased by a gate source voltage of Vcc. Its Vdsmin sets up the LSSST voltage. The ratio of Vdsmin of MOS12, Vdsmin(12), and the Vdsmin of MOS(10), Vdsmin(10) can be expressed as follows:

$$Vdsmin(12)Vdsmin(10)=n11/n12 \quad \text{(Eq.13.)}$$

Hence, based on Eq.13, the embodiment shown in FIG. 5 can set the saturation detecting and warning threshold voltage to any multiple or fraction of the minimum drain source voltage Vdsmin(10) of the output transistor MOS10 by varying the area ratio of MOS11 and MOS12 (n11/n12). In practical circuits the saturation detection and warning threshold Vdsmin(12) is larger than Vdsmin(10), hence n11 is chosen to be typically larger than n12 (n11>n12). The gate of MOS17 is driven by OPAMP10 to servo the drain voltage of MOS11 to be approximately the same as the drain voltage of MOS12. As the drain voltage of MOS12 equals the drain voltage of MOS10 at the trip point of SATCompL, the servo loop of OPAMP10 ensures that the drain voltages of MOS11 and MOS10 are matched at the decision (trip) point of the SATCompL comparator. This results in good current ratio accuracy between MOS10 and MOS11. This method of servoing the gate of MOS17 to make Vds(11) substantially equal to Vds(10), using Vds(12) as a proxy for Vds(10), can also be used in the embodiments shown in FIG. 3 and FIG. 4. PMOS21, PMOS22 and Inv1 inverter generate a small hysteresis in FIG. 5, similarly to what was shown in FIG. 4.

FIG. 6. shows one embodiment of a comparator circuit that can be used to implement the high side saturation warning comparator, SATCompH, used in the invention. Those skilled in the art will understand that the low side saturation warning comparator, SATCompL, can be implemented by a similarly architected circuit. The comparator core of the circuit, consisting of transistors MOS19, 20,21,22,26,27 and PMOS17, 18, is a circuit known in the prior art.

In amplifiers driven into saturation it is often useful to provide a soft clamp circuit that keeps the amplifier in its active region with a closed feedback loop to avoid ringing when the amplifier enters into and exits from hard saturation. In the context of the invention, the soft clamp circuit should clamp the output voltage between the saturation warning threshold level and the hard saturation (Vdsmin) level. This means that the soft clamp circuit has to be adaptive, following the changes in saturation warning threshold due to process, temperature, supply voltage and load current variations.

In one embodiment, shown in FIG. 6, the clamp output signal is generated as part of the saturation warning comparator circuit. The circuit elements MOS28, MOS19, MOS23, MOS24, MOS29, PMPS3O, PMOS31, together with MOS19, MOS20, MOS27 and PMOS17, transistors that are also used in the comparator section of the circuit, form a nonlinear transconductance amplifier. The nonlinear transconductance amplifier of circuit of FIG. 6 generates a nonlinear ClampHout Output current when the+ input of the comparator (that is connected to the output of the amplifier in the embodiments shown in FIGS. 2 to 5)is driven higher than the—input of the comparator(that is tied to the HSSST)by a given offset.

The value of the offset is set by the size of PMOS19, px, relative to the size of PMOS18 and PMOS19, Px, and the value of IB1 bias current. The gain of the clamp is dependent of the size ratio of PMOS30 and PMO31, Q/q, multiplied by the size ratio of MOS29 and MOS24, N/n. The ClampH Output is tied to the inverting input of the amplifier to accomplish the clamping function. In one embodiment, the low side comparator and clamp circuit is a straight transposition of the high side circuit shown in FIG. 6 (all NMOS and PMOS transistors are replaced with PMOS and NMOS transistors respectively and all sink or source currents are replaced with source and sink currents respectively).

FIG. 7 shows a single supply inverting amplifier utilizing the saturation warning and the clamp circuits of the invention. The LSSST and HSSST voltages are generated within AMP1, utilizing one of the embodiments described above. The ClampHout and ClampLout current outputs of the SATCompH and SATCompL comparators are tied together and connected to the inverting input of amplifier AMP1. If the output voltage of AMP1 is driven higher than HSSST or lower than LSSST the appropriate comparator's output goes high and the output of the OR gate becomes logic H, signaling saturation warning. If the output of OPAMP1 is driven higher than HSSST and it surpasses HSSST by the offset described in connection with FIG. 6, source current starts to flow from the ClampHout terminal of SATCompH into the inverting input of AMP1. As the gain of the clamp circuit is nonlinear it can easily balance the excess negative input current of the amplifier through R13 with small increase of the output voltage beyond the offset, limiting (clamping) the output voltage of AMP1 before it can reach hard saturation. The operation of the clamp circuit is similar on the low side, with current directions inverted.

FIG. 8. shows one embodiment of an LDO linear voltage regulator utilizing the invention. The High Side Saturation Detector and Warning Circuit 810 is connected to the pass transistor PFET800 of the LDO. The High Side Saturation Detector and Warning circuit 810 can include the elements shown in block 510 of the embodiment of the invention shown in FIG. 5 (or any of the other embodiments shown in FIGS. 2 to 5) generating the high side saturation sense threshold HSSST, and comparator SATCompH. In one embodiment, the PFET800 pass transistor corresponds to the high side output transistor PMOS9 of the amplifier in the embodiment shown in FIG. 5.

As the drain source voltage of the pass device PFET800 drops below the HSSST threshold the output of the comparator SATCompH changes to logic "H" level, indicating that the LDO is close to or about to drop out, losing the regulation of its output voltage Vout. The output of comparator SATCompH is utilized as the Drop-out Warning output signal of circuit 810 in FIG. 8. An optional CLAMPOUT output signal of circuit 810 (not shown) can correspond to the ClampHout signal of the comparator circuit shown in the embodiment of FIG. 6, and can be connected to the noninverting input of AMP800.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A saturation detection and warning circuit to detect the impending saturation of an amplifier, the amplifier having a supply voltage, having inverting and non-inverting input terminals, the amplifier including at least one output transistor providing an output current and an output voltage on an output terminal, having an amplifier front end circuitry connected to the input terminals and controlling the output current of the output transistor, the saturation detection and warning circuit comprising:
a threshold voltage that tracks changes in process, temperature,
supply voltage and output current thereby maximizing the usable output signal range of the amplifier.

2. The saturation detection and warning circuit of claim 1 comprising:
a current mirror transistor having a current that matches the output current of the output transistor with a substantially fixed ratio when a Vds drain source voltage of the output transistor is close to the threshold voltage,
a replica transistor having a current that tracks the output current of the output transistor when the Vds drain source voltage of the output transistor is close to the threshold voltage, the replica transistor having a drain-source voltage that generates the threshold voltage; and biasing circuitry that biases the replica transistor to set the drain source voltage of the replica transistor to the desired threshold voltage.

3. The saturation detection and warning circuit of claim 2 where the current mirror transistor and replica transistor are implemented with a single transistor.

4. The saturation detection and warning circuit of claim 2 further comprising:

a comparator to compare the Vds drain source voltage of the output transistor and the threshold voltage and to generate a warning signal if the Vds falls below the threshold voltage.

5. The circuit of claim 4, wherein the comparator includes controlled hysteresis.

6. The saturation detection and warning circuit of claim 2 where the threshold voltage is a substantially fixed fraction of a Vdssat voltage of the output transistor, where Vdssat is a drain source voltage of the output transistor at a border of its saturated operating region.

7. The saturation detection and warning circuit of claim 2 where the threshold voltage is a substantially fixed multiple of a minimum drain source voltage of the output transistor, Vdsmin, that can be attained with a given supply voltage and the amplifier front end circuit driving a voltage on a control terminal of the output transistor to its maximum absolute value.

8. The circuit of claim 1, further comprising:

a clamp circuit to clamp the output voltage of the amplifier at a controlled level between the threshold voltage and a maximum output voltage the amplifier can provide, that tracks the threshold voltage with an offset.

9. The circuit of claim 8, wherein the offset is substantially fixed.

10. The circuit of claim 8 including a transconductance amplifier with a nonlinear gain having an inverting and a non-inverting input terminals, one connected to the threshold voltage the other connected to the output terminal of the amplifier, a controlled offset voltage, a clamp output terminal generating a clamp current that is dependent of the voltage difference between its two input terminals, the clamp output terminal being connected to an inverting input terminal of the amplifier.

11. The circuit of claim 10, further comprising:

a comparator to compare a Vds drain source voltage of the output transistor and the threshold voltage and to generate a warning signal if the Vds falls below the threshold voltage, where the clamp circuit and the comparator circuit share significant circuitry to minimize die size and cost.

12. A saturation detection and warning circuit to detect the impending saturation of a linear amplifier, the linear amplifier having at least one output transistor providing an output current and an output voltage on an output terminal, having a control circuitry controlling a control terminal of the output transistor, the saturation detection and warning circuit comprising:

a threshold voltage that tracks changes in process, temperature, supply voltage and output current, and a comparator comparing the threshold voltage to a Vds drain source voltage of the output transistor generating an output signal indicative of the impending saturation of the linear amplifier if the Vds drain source voltage of the output transistor falls below the threshold voltage.

\* \* \* \* \*